United States Patent [19]

Rosler et al.

[11] 4,287,105

[45] Sep. 1, 1981

[54] FLASH RESISTANT EPOXY ENCAPSULATING COMPOSITION AND PROCESS FOR PREPARING SAME

[75] Inventors: Robert K. Rosler, Toledo; Donald B. Gore, Swanton; Malcolm N. Riddell, Perrysburg; Earl R. Hunt, Toledo, all of Ohio

[73] Assignee: Plaskon Products, Inc., Toledo, Ohio

[21] Appl. No.: 112,067

[22] Filed: Jan. 14, 1980

[51] Int. Cl.$^3$ .............................................. C08L 91/00
[52] U.S. Cl. ............................ 260/18 EP; 260/37 EP
[58] Field of Search ............ 260/18 EP, 28 R, 37 EP

[56] References Cited

U.S. PATENT DOCUMENTS

| | | | |
|---|---|---|---|
| 3,849,187 | 11/1974 | Fetscher et al. | 260/37 EP |
| 3,980,607 | 9/1976 | Johannes | 260/37 EP |
| 4,022,749 | 5/1977 | Kuechler | 260/37 EP |
| 4,042,550 | 8/1977 | Tuller et al. | 260/37 EP |

Primary Examiner—Lewis T. Jacobs

[57] ABSTRACT

A flash resistant epoxy encapsulating composition and its process of manufacture. The composition comprises a blend of from about 15 to about 80 weight percent epoxy resin, from about 9 to about 82 weight percent filler, from about 0.01 to about 2 percent catalyst by weight of resin, from about 10 to about 50 percent hardener by weight of resin, from about 3 to about 12 percent flash retardant by combined weight of resin and hardener and up to about 1.5 weight percent lubricant. The cured blend physically consists essentially of particles intimately and entirely embedded in a matrix. The process comprises blending the components of the above blend followed by milling the resulting blend between the rolls of a differential roll mill equipped with plows where the rolls have different surface temperatures, the hotter of the rolls being near the melting temperature of the resin.

80 Claims, 3 Drawing Figures

FLASH RESISTANT EPOXY ENCAPSULATING COMPOSITION AND PROCESS FOR PREPARING SAME

BACKGROUND OF THE INVENTION (a) Field of the Invention

This invention relates to epoxy encapsulating compositions which are used to encapsulate semiconductor devices such as integrated circuits, transistors, diodes and other electronic components. The invention more particularly relates to encapsulating compositions which are flash resistant, i.e., resistant to flow from encapsulating molds through openings to the leads of an electronic component or through parting lines at the interface of pieces of the mold.

(b) History of the Prior Art

Epoxy molding compounds have found wide use as encapsulatants of semiconductor devices such as integrated circuits, transistors, diodes and other electronic components. Such encapsulates contain an epoxy resin, a hardener, a catalyst, a mold release agent, usually a filler, usually a flame retardant, usually a colorant and sometimes a coupling agent.

Exemplary formulations of these ingredients are described in U.S. Pat. Nos. 4,042,550 to Tuller et al; 4,034,014 to Curtis, Jr. et al; 3,849,187 to Fetscher et al; 3,862,260 to Sellers et al; 3,789,038 to Curtis et al and 3,280,218 to Partansky et al. Such compositions are generally classified by the type of hardener, with phenol-derived and substituted phenol- derived resin, carboxylic acid anhydride and amine hardeners being most common. Frequently, the molding compounds are highly filled (over 50% filler by weight), but for some applications, compositions containing low percentages of filler or even unfilled compositions may be used.

When encapsulating integrated circuit devices, it is objectionable to have too much of the epoxy encapsulating composition flow out of the mold along the many leads of the device, since this material, called flash, acts as an electrical insulator, making it necessary to clean this material from the leads before the device is used or alternatively to discard the device.

Attempts have been made to reduce flash by appropriate reformulating of the encapsulating composition, e.g. by utilizing certain additives such as fumed silica in the encapsulating composition. Such additives do, in fact, reduce flash to some extent; however, in the absence of proper processing, flash is still not sufficiently reduced and even with some types of processing such as extruders, flash is not reduced as much as desirable.

Such products believed to be commercially made using extruders and a flash retardant, when examined under an electron microscope appear to consist entirely or partially of closely packed, usually jagged, particles rather than particles entirely embedded in a matrix.

It was previously recognized that a differential roll mill with plows could be used with alkyd molding compounds to obtain good high-shear mixing and blending. Either prior to or subsequent to the present invention, it was known that epoxy encapsulating compositions could be mixed on such a mill. It has not, however, been previously recognized that superior flash resistant epoxy compositons could be prepared using both a differential mill with plows and a flash retarding composition as subsequently described.

BRIEF DESCRIPTION OF THE INVENTION

The invention is a flash resistant epoxy encapsulating composition and a process for its preparation. The process comprises blending at least one epoxy resin, at least one each of a resin hardener, a catalyst component and flash retarding composition and optionally, other additives such as flame retardants, fillers, lubricants, colorants and coupling agents with a flash retarding composition.

After blending, the resulting blend is milled between the rollers of a differential roll mill. More than one blend may be followed by mixing the blends, either prior to or after milling on the differential roll mill, to form the finished flash resistant encapsulating composition.

The differential roll mill comprises a hot roller and a cold roller spaced between one and six and preferably between one and four millimeters apart along their lengths. Each of the rollers is rotated about its longitudinal axis in opposite directions at different surface velocities and preferably towards each other at the top portions. The longitudinal axes are usually approximately horizontally disposed for ease of processing. The surface temperature of the hot roller is near the melting temperature of the resin if present, i.e., within about 20° C. of the melting temperature, but at at temperature insufficient to cure the resin within the residence time of the resin on the hot roller of the mill. In general, the surface temperature of the cold roller is well below the melting temperature of the resin. The mill is further supplied with a series of plows having lower edges that conform to the roll curvature. The plows are usually above the hot roller. Each of the plows is mounted approximately at a 10° to 50° angle to the planes which are perpendicular to the longitudinal axis of the hot roller. The lower edges of the plows are shaped and the plows are mounted such that each of the edges are within 2 millimeters and preferably within 1 millimeter of the surface of the hot roller over a distance along the edge which is equal to at least 5% of the circumference of the hot roller. The plows are further positioned such that blend introduced at a feed position of the differential roll mill is forced by the plows along the rotating hot roller to a discharge position of the differential roll mill. The feed position is usually, but not necessarily, at one end of the rollers and the discharge position is usually, but not necessarily, at the opposite end of the rollers. Multiple feed and discharge positions may be used.

Generally, from about 2 to about 16 plows are used and the adjacent plows are desirably each within 12 and preferably within 4 centimeters of at least one identical plane perpendicular to the rotational axis of the hot roller and may intersect at least one common plane perpendicular to the rotational axis of the hot roller. Desirably, a majority of the plows are at approximately the same angle to planes perpendicular to the rotational axis of the hot roller, although plows near the feed position are frequently at a substantially different angle than the remaining plows. This is to provide for the density change of the blend which increases rapidly at the feed position of the mill.

The flash retarding composition is usually fumed silica in a quantity of from about 3 to about 12 percent by combined weight of resin and hardener in the composition. Usually from about 9 to about 82 percent of at least one filler by weight of finished composition is included as a component in the blending step. At least one catalyst is usually present in a quantity of about 0.01 to about 2 percent by weight of resin. Similarly, there is usually up to about 1.5 percent and preferably at least 0.5 percent lubricant by weight of resulting blend included as a component in the blending step. From about 0.01 to about 3 percent of at least one colorant, from about 0.5 to about 5 percent of at least one flame retardant composition and from about 0.05 to about 2 percent of at least one coupling agent may also be incorporated as components in the blending step.

The product of the invention which may be made in accordance with the process comprises at least one each of a filler, a resin, a resin hardener, a catalyst, a flash retarding composition, usually at least one lubricant in the blend prior to curing and usually one or more of flame retardants, colorants and coupling agents. The product under an electron microscope seems to be particles intimately and entirely embedded in a matrix.

DETAILED DESCRIPTION OF THE INVENTION

Figure 1:
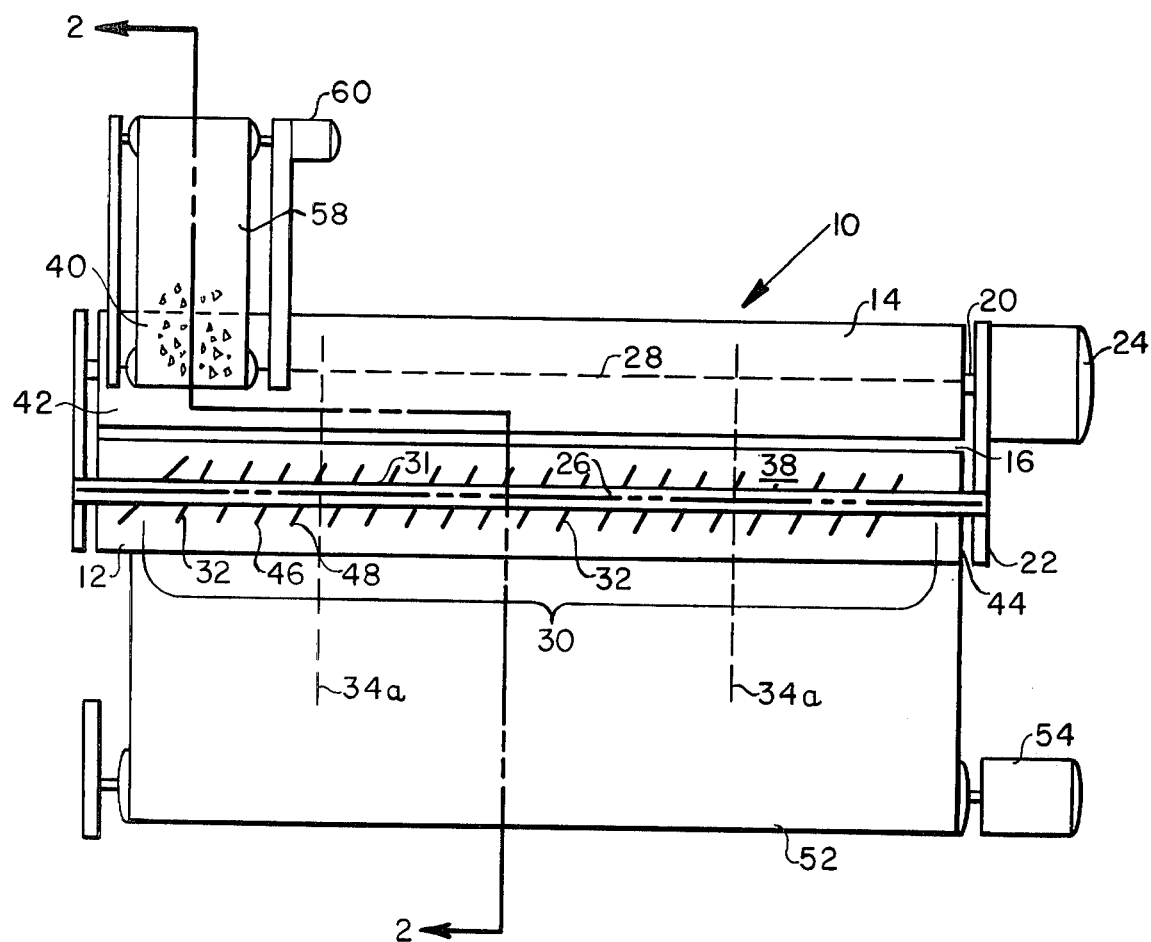
FIG. 1 is a top plan view of a differential roll mill which can be used to practice the process of the invention.

Flash resistant epoxy encapsulating compositions, as contemplated herein, are compositions which comprise an epoxy resin for encapsulating or enclosing an article and especially for encapsulating or enclosing electronic components such as solid state diodes, transistors, integrated circuits and passive electronic devices such as resistors, capacitors and coils. Such encapsulating compositions are particularly desirable and useful for encapsulating integrated circuits.

"Flash resistant", as used herein, means that the encapsulating composition when used to encase or encapsule the electronic component, does not have a tendency to flow or bleed through small openings out of the mold cavity, such as openings surrounding leads to the component.

The initial blending of the components of the encapsulating composition may be accomplished by any suitable means; however, the most suitable methods are blending methods which result in an exceedingly fine uniformly blended material having a particle size on the order of a few microns. An example of such a method of blending is ball milling of the components of the blend.

Desirably, the blend is then precompacted prior to high shear processing on a differential roll mill, to minimize dusting and to simplify handling of the blend to the differential mill. Examples of suitable methods for precompacting the blend are by processing on a combining mill; pelletizing of the power via a tableting or preforming operation; feeding the powdered blend into briquetting equipment; heating of the powder on a moving belt resulting in compaction due to the weight of the material itself and packing the powdered blend between two counter rotating solid conveyor belts placed one above the other. The preferred method for precompaction is briquetting in which powder is fed to the nip of two counter rotating equal speed rolls. The roll surfaces are machined to form a waffle like pattern and are forced together by means of hydraulic cylinders. The powdered blend passes between the rolls which causes the formation of rod like briquettes which are suitable for feeding to the rolls of the differential mill. Desirably, the compacted briquettes or particles have an average size of from about 3 to 6 millimeters in diameter and 3 to 12 centimeters in length.

The components which are blended comprise at least one epoxy resin, at least one each of a resin hardener, a catalyst, a flash retarding composition, and usually at least one each of a filler and a lubricant and optionally at least one each of a colorant, a flame retardant and a coupling agent.

Desirably, the resin is an epoxy novolac molding compound or an epoxy anhydride molding compound. The invention is not, however, limited to these specific epoxy containing components since other epoxy molding compounds such as epoxy amine compositions can be used.

Essentially any epoxy normally used in molding compounds can be used in the flash resistant epoxy encapsulating composition of the present invention. In general, multifunctional epoxy resins, typically epoxidized aromatic alcohol novolacs are used, e.g., epoxidized phenolic novolacs and epoxidized cresol novolacs. Other epoxies, such as the glycidyl ethers of Bisphenol A or of tetraphenol ethane or dicyclopentadiene dioxide, are also suitable. Thus the term "epoxy resin" is not to be understood as requiring a polymeric material as is often understood for the term "epoxy resins," but rather includes any material containing sufficient reactive oxirane groups to obtain an average epoxy functionality greater than one. Usually from about 15 to about 80 and preferably from about 20 to about 65 percent resin by weight of finished composition is used. It is understood that the resin may be a polymeric or polymerizable mixture containing an epoxy component in significant quantity, e.g., in excess of 20 weight percent of the resin mixture.

Similarly, in the case of epoxy novolac molding compounds, any novolac hardener of the type conventionally used may be employed as the resin hardener in the flash resistant epoxy encapsulating composition of the present invention. For example, phenolic novolacs, cresol novolacs and Bisphenol A derivatives are suitable. This group is referred to herein by the broad term "phenol-derived" resin to include all such compounds conventionally used as hardeners for epoxy resins based upon reactive phenolic and substituted reactive phenolic groups. Hardeners are usually present in the amount of from about 10 to about 50 percent by weight of resin in the finished composition.

In the case of epoxy anhydride molding compounds, the present invention is particularly applicable to encapsulating compositions employing as a hardener, a polyanhydride of maleic monomer and at least one alkyl styrene monomer (or prepolymers of the polyanhydride and the epoxide) as described in the above referenced U.S. Pat. Nos. 4,042,550 and 3,789,038.

The present invention is also applicable to epoxy molding compounds with, as hardener, the benzophenone tetracarboxylic dianhydrides described in U.S. Pat. No. 3,468,824 to Williams, and the anhydrides described in U.S. Pat. Nos. 3,272,843 and 3,336,260 to Spatz et al. Similarly, the flash resistant epoxy encapsulating compositions of the present invention may be used with other anhydrides as hardeners such as are employed in combination with epoxy resins in various applications.

A variety of catalysts, appropriate to the hardener used, may be employed to promote the curing of the present compositions. Such catalysts include basic and acidic catalysts such as the metal halide Lewis acids, e.g. boron trifluoride, stannic chloride, zinc chloride and the like; metal carboxylate salts such as stannous octoate and the like; amines, e.g., alpha-methyl benzyldimethylamine, dimethylethylamine, dimethylaminomethylphenol, 2,4,6-tris(dimethylaminomethyl)phenol, triethylamine, and imidazole derivatives and the like. The catalysts are employed in conventional amounts such as from about 0.01 to 2% by weight of the combined weight of epoxy resin.

Mold release agents (that is lubricants) are generally included in the flash resistant epoxy encapsulating compositions of the present invention. Exemplary lubricants are carnauba wax; montanic acid ester wax; polyethylene wax; polytetrafluoroethylene wax; glycerol monostearate; calcium, zinc and other metallic stearates; paraffin waxes and the like.

For many applications, the epoxy molding compounds are preferably filled, and preferably contain from about 9 to about 82 percent of a filler by weight of finished composition. The flash resistant epoxy encapsulating compositions most preferably contain at least about 50 weight percent filler. The filler may comprise one or more of the several conventional fillers such as silica, calcium carbonate, calcium silicate, aluminum oxide, glass fibers, clay or talc. Especially preferred are filled compositions wherein the filler is predominately silica. Other fillers are preferably employed in lesser amounts in combination with silica as the predominant filler.

Many of the flash resistant epoxy encapsulating compositions of the present invention also contain a colorant such as carbon black, pigments, dyes and the like. When a colorant is used, it is usually present in the amount of from about 0.01 to about 3% by weight of resulting blend.

Many of the encapsulating compositions of the present invention also include a coupling agent, and especially a silane coupling agent of the type known to improve wet electrical properties of the composition. The silane coupling agents may be characterized by the formula R'-Si(OR)$_3$ wherein R' represents an organo-functional group such as amino, mercapto, vinyl, epoxy or methacryloxy, and OR represents a hydrolyzable alkoxy group attached to the silicon. Preferably coupling agents such as are described in U.S. Pat. Nos. 4,042,550 and 3,849,187 are used.

The encapsulating composition of the present invention may also contain at least one flame retardant which is usually present in an amount of from about 0.5 to 10% by weight of resulting blend. The flame retardant is most preferably a halogen-containing organic compound or an antimony oxide compound or combinations thereof. The halogen-containing organic compound used in the composition may be of any type, but is preferably of the reactive type and preferably has, as halogen, chlorine or bromine. Exemplary halogenated organic compounds are described in U.S. Pat. No. 4,042,550, which description is incorporated herein by reference and includes especially halogenated bisphenol A and derivatives of bisphenol A such as tetrabromo bisphenol A. Exemplary of reactive halogenated organic compounds which should be counted as a part of the epoxy resin are glycidyl ethers of halogenated resins such as diglycidyl ether of tetrabromobisphenol A. The halogenated-organic compound may be a separate additive or may be contained in one or more of the organic components of the encapsulating composition, especially the epoxy or the hardener, but also possibly other components such as the lubricant or the colorant or the filler. The term "halogen-containing" is meant to include organic compounds in which the halogen is present from any source including halogenation of a component or its precursor (such as a monomer) or by addition of halogen-containing monomers by reactions in which the halogen is not completely removed. Exemplary of reactive halogen-containing organic compounds which should be counted as a part of the hardener are halogenated anhydrides such as tetrabromo and tetrachlorophthallic anhydride. Tetrabromobisphenol A and other halogenated monomers may also be considered part of the hardener, especially the phenol-derived or substituted phenol-derived hardener. The flame retardant may also be or include an antimony oxide such as antimony pentoxide, antimony tetraoxide or antimony trioxide. The combinations of these antimony oxides may be used with a halogenated component which often results in a synergistic flame retardant effect.

As a required component of the blend, a flash retarding composition must be used which is usually present in a quantity of from about 3 to about 12% by combined weight of the resin and hardener in the composition. By far, the most preferred flash retarding composition is fumed silica. The fumed silica is usually prepared by flame hydrolysis of silicon tetrachloride which results in a silica having an average particle size of about 16 millimicrons with a spongy or porous appearance or surface. Other flash retarding compositions which have been found to have some effect, although not the dramatic effect of fumed silica, are diatomaceous earth and precipitated colloidal silicas.

After blending the components and optionally compacting the blend for ease of handling, the blend is fed by any suitable means, such as a conveyor, to a differential roll mill which, as previously discussed, comprises a hot roller and a cold roller spaced between one and six millimeters apart along their lengths.

The differential roll mill may be essentially any such mill known in the art. In general, the rollers of the mill are rotated in opposite directions at different surface velocities about their respective longitudinal axes which are approximately horizontally disposed. In general, the relative rotational speeds of the rollers is at a ratio of between 1.1:1 and 1.3:1 and the rotational speed of the hot roller is generally from about 10 to 30 rpm. The rollers are rotationally mounted by any suitable bearing means to a suitable support. Examples of such suitable bearing means are roller bearings, ball bearings and sleeve bearings. The support means may be a frame or any structural component attached to a building or the earth. The rollers are rotated by any suitable rotating means, such as an electric motor or a steam engine, connected to a central shaft on the roller by any suitable means such as a chain, a belt or gears. In general, positive drive mechanisms such as chains or gears are preferred.

The surface temperature of the hot roller in general is near the melting temperature of the resin in the blend, i.e., within about 20° C. of the melting temperature of the resin, but is at a temperature insufficient to cure the resin within the residence time of the blend on the hot roller of the mill. Usually, the surface temperature of the hot roll is between 65° and 95° C. and is maintained by any suitable heating means or mechanism such as hot water circulating through the hot roller or an electrical heating element. The hot roll temperature may be as high as 115° C. for some special resins but is almost always below 100° C.

The mill is further supplied with a series of plows which have lower edges that fit the roll curvature. Each of the plows is mounted approximately above the hot roller of the mill at a 10° to 50° angle to planes perpendicular to the longitudinal axis of the hot roller. The lower edges are shaped and the plows are mounted such that each of the edges are within 2 millimeters of the surface of the hot roller for a distance equal to at least 5% of the circumference of the hot roller. The leading edge portion of each plow which the blend on the mill rotates against is sharpened to a knife edge from 3 to 6 inches along the plow edge starting at the roll surface to help cut the material from the roll. The plows are positioned such that blend introduced at a feed position on the differential mill is forced by the plows and by subsequent material on the mill along the rotating hot roller to a discharge position on the differential roll mill.

Although not essential, usually, adjacent plows are each within 12 and often within 4 centimeters of at least one identical plane perpendicular to the rotational axis of the hot roller and adjacent plows in at least one location may intersect at least one common plane perpendicular to the rotational axis of the hot roller. The majority of the plows are mounted at approximately the same angle to planes perpendicular to the rotational axis of the hot roller and in general from about 2 to about 16 plows are used. In general, the plows are positioned so that, at the rotational velocity of the rolls, the residence time of the blend from the feed position to the discharge position of the differential mill is from about 4 to about 120 seconds. The means for supplying the blend to the mill, of course most desirably, deposits the blend at or proximate to the feed position of the differential mill.

It should be understood that depending upon the specific epoxy molding compound formulation being processed, it's adhesiveness to the roll and the desired residence time on the mill, variations can be made in the number of plows, their angle relative to the rotational axis of the hot roll and the spacing between the plows to produce the desired product.

Figure 2:
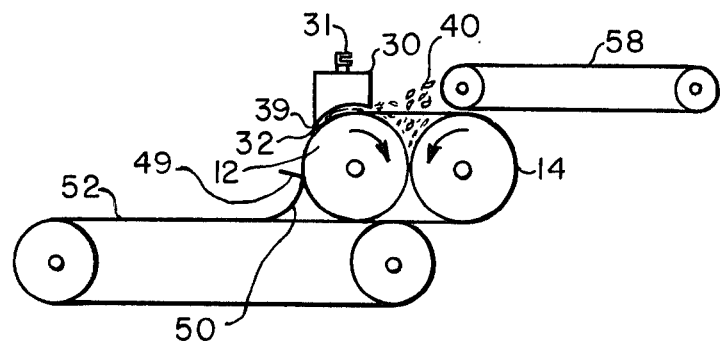
FIG. 2 is a cross sectional end view of the mill of FIG. 1.
Figure 3:
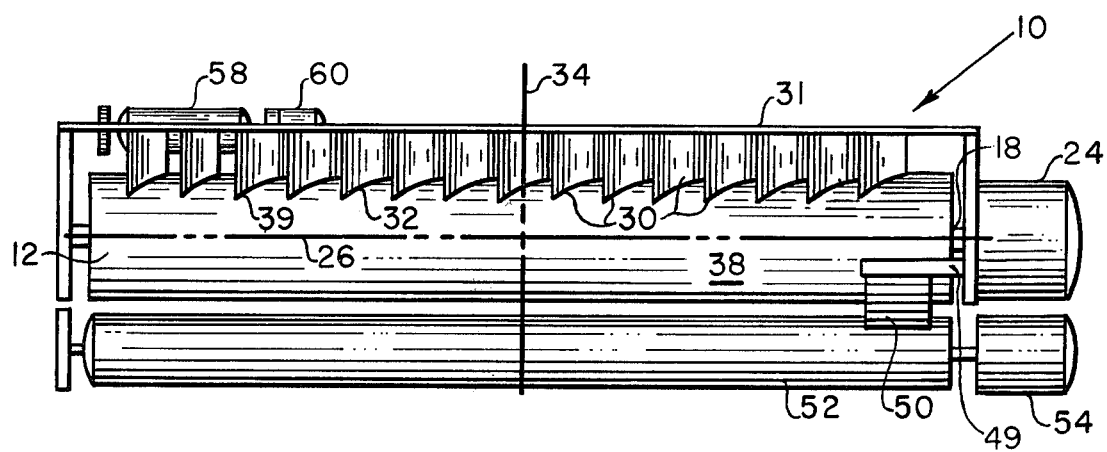
FIG. 3 is a front view of the mill of FIG. 1.

The drawings illustrate a differential mill which may be used in accordance with the process of the invention and a description of the mill is provided for clarity and understanding the process. As seen in FIGS. 1, 2 and 3, a differential roll mill (10) which may be used in accordance with the invention, comprises a hot roller (12) and a cold roller (14). A space (16) is provided between the hot and cold rollers along their lengths. The space is between 1 and 6 millimeters and preferably between 1 and 4 in width. Hot and cold rollers (12) and (14) are mounted by axial shafts (18) and (20) respectively into frame (22). Shafts (18) and (20) are rotationally driven by a drive means (24) by means of chains and sprockets within frame (22) not shown. Rollers (12) and (14) are mounted so that their longitudinal axes (26) and (28) respectively are horizontally disposed. A series of plows (30) are provided, each of which has a lower edge (32). Each of the plows is mounted approximately above hot roller (12) at a 10° to 50° angle to planes (34a) perpendicular to longitudinal axis (26) of hot roller (12). Edges (32) of plows (30) are shaped and said plows are mounted on support (31) such that each of the edges (32) are within 2 millimeters and preferably within 1 millimeter of the surface (38) of hot roller (12) for a distance equal to at least 5% of the circumference of the hot roller (12). Each of the plows (30) are provided with a cutting edge (39). Plows (30) are positioned such that blend (40) introduced at the feed end (42) of differential roll mill (10) is forced by plows (32) along the rotating hot roller (12) to the discharge end (44) of differential roll mill (10). In general, adjacent plows, i.e., (46) and (48), are each within 4 centimeters of at least one identical plane (34a) perpendicular to rotational axis (26) of hot roller (12) or may intersect at least one common plane perpendicular to the rotational axis of hot roller (12). Milled product (50) is cut from the roll (12) by a knife (49) and collected by conveyor (52) driven by motor (54). Compacted blend (40) is supplied to the feed end (42) by means of conveyor (58) driven by motor (60).

The residence time of the material on a hot roller with a fixed number of plows can be increased using fewer plows. This causes the blend to be squeezed along the surface of the hot roller in the larger gap between two plows. For some epoxy materials, maximum improvement in flashing characteristics of the composition is achieved by using fewer plows. For some epoxy materials, it has been necessary to operate using fewer plows to improve the adhesion of the material to the rolls so that proper plowing action of the mill could be obtained. This is particularly true at the feed end of the mill where material coming on to the hot roller sticks more readily to a band of material already on the roller than to the roller surface itself.

The cured flash resistant epoxy encapsulating composition manufactured in accordance with the process of the invention under a scanning electron microscope physically appears to be a series of particles (believed to be filler particles) incorporated into a glue-like matrix; whereas, the best products manufactured in accordance with the prior art appear, at least in part, to be closely packed jagged particles. The product manufactured in accordance with the present invention is characterized by having exceptionally good flash resistance when used to encapsulate electronic components in molds provided with passageways permitting the leads to the electronic component.

The following example serves to illustrate and not limit the invention. Unless otherwise indicated, all parts and percentages are by weight.

EXAMPLE

The following components are blended and ground in a ball mill until the average particle size in the blend is less than about 10 microns and until the blend appears uniform. The components blended are:
(a) 16.25 weight percent of an epoxy cresol novolac resin with a softening point (by ASTM test E-28) of 67° to 76° C. and an epoxy equivalent weight of 200 to 220;
(b) 1 percent of a fumed silica flash retardant;
(c) 0.96 weight percent of antimony trioxide flame retardant;
(d) 15 weight percent of tabular aluminum oxide filler;
(e) 57.12 weight percent of crystalline silica filler;
(f) 0.15 weight percent of 2,4,6-tris(dimethylaminomethyl)phenol catalyst;
(g) 0.25 weight percent of carbon black as a colorant;
(h) 0.32 weight percent of calcium stearate lubricant;
(i) 0.20 weight percent of γ-(2,3 epoxy propoxy)propyl trimethoxysilane coupling agent;
(j) 7.39 weight percent of novolac hardener; and (k) 1.36 weight percent of brominated bisphenol A flame retardant and hardener.

After milling, the blend is compacted by feeding the powder to the nip of two counter rotating equal speed rolls. These rolls are machined to form a modified waffle pattern and are forced together by means of hydraulic cylinders. The powder passes through the nip at the rate of approximately 2000 lbs. per hour on a machine equipped with 7 inch wide by 10 inch diameter rolls. The roll pressure causes formation of rod-like briquettes which are then suitable for feeding to the rolls of the differential roll mill.

The roll mill used is essentially the same as that previously described in reference to the drawings and has a rotational velocity ratio of the hot roller to cold roller of 1.26:1. The hot roller rotational velocity is 25 rpm and the roller size of each of the rollers is about 46 cms. in diameter by about 122 cms. in length. The surface temperature of the hot roller is maintained at about 80° C. and the surface temperature of the cold roller is maintained at about 10° C. The gap between the rollers is maintained at about 2 millimeters. 12 plows are used as previously described. The first plow near the inlet end of the differential roll mill is at an angle of approximately 10° to planes perpendicular to the axis of the hot roll and the balance of the plows are at an angle of about 30° to planes perpendicular to the axis of the hot roller. The leading edges of the plows are the nearest part of each plow toward the inlet end of the differential mill. The residence time of the composition on the differential mill is about 25 seconds.

The resulting encapsulating composition is cooled and granulated and is tested for flash resistance by encapsulating several hundred integrated circuit parts in a mold yielding 20 encapsulated parts from each molding operation. The devices encapsulated are 14 lead devices. The mold temperature is about 188° C. and the transfer pressure is about 50 kilograms per square centimeter. The resulting encapsulated electronic circuits show very little flashing along the leads.

When a prior art encapsulating composition, which is not prepared in accordance of the invention and which contains no fumed silica flash retardant, is used under essentially the same conditions, the electronic components have leads which are seriously covered with the encapsulating composition which can not be easily removed.

Utilizing a prior art composition wherein fumed silica in incorporated but the processing in accordance with the present invention is not used, results in encapsulated electronic components having leads coated with flashed encapsulating composition which coating is not as severe as products prepared in compositions without fumed silica but which is more serious than products prepared in accordance with the present invention.

What is claimed is:

1. A process for the preparation of a flash resistant epoxy encapsulating composition comprising:
    (a) blending a flash retarding composition with at least one each of an epoxy resin, a resin hardener, and a catalyst to obtain at least one resulting blend;
    (b) milling each resulting blend between rolls of a differential roll mill which comprises a hot roller and a cold roller spaced between one and six millimeters apart along the lengths thereof, said rollers being rotated in opposite directions toward each other at their upper portions at different surface velocities about their respective longitudinal axes, which are approximately horizontally disposed, the surface temperature of said hot roller being near the melting temperature of said resin for a blend containing resin but at a temperature insufficient to cure said resin within the residence time of the resin on the hot roller of the mill, said mill being further supplied with a series of plows having edges, each of said plows being mounted approximately above the hot roller about a 10° to 50° angle to planes perpendicular to the longitudinal axis of said hot roller, said edges being shaped and said plows being mounted such that each of the edges are within 2 millimeters of the surface of the hot roller for a distance equal to at least 5% of the circumference of the hot roller, said plows being positioned such that each such blend introduced at a feed position of said differential roll mill is forced by said plows along said rotating hot roller to a discharge position of said differential roll mill; and
    (c) when more than one blend is made, mixing said milled blends to form the encapsulating composition.

2. A process for the preparation of a flash resistant epoxy encapsulating composition comprising:
    (a) blending components comprising at least one each of an epoxy resin, a resin hardener, a catalyst and a flash retarding composition; and
    (b) milling the resulting blend between rolls of a differential roll mill which comprises a hot roller and a cold roller spaced between one and four millimeters apart along the lengths thereof, said rollers being rotated in opposite directions at different surface velocities about their respective longitudinal axes, which are approximately horizontally disposed, the surface temperature of said hot roller being near the melting temperature of said resin for a blend containing resin but at a temperature insufficient to cure said resin within the residence time of the resin on the hot roller of the mill, said mill being further supplied with a series of plows having edges, each of said plows being mounted approximately above the hot roller at a 10° to 50° angle to planes perpendicular to the longitudial axis of said hot roller, said edges being shaped and said plows being mounted such that each of the edges are within 2 millimeters of the surface of the hot roller for a distance equal to at least 5% of the circumference of the hot roller, said plows being positioned such that each such blend introduced at a feed position of said differential roll mill is forced by said plows along said rotating hot roller to a discharge position of said differential roll mill.

3. The process of claim 1 wherein from 2 to 16 plows are used, the rollers are spaced between 1 and 4 millimeters apart and the majority of the plows are at approximately the same angle to planes perpendicular to the rotational axis of the hot roller.

4. The process of claim 1 wherein from about 15 to about 80 percent epoxy resin by weight of finished composition is used in a blending step.

5. The process of claim 3 wherein from about 20 to about 65 percent epoxy resin by weight of finished composition is used in a blending step.

6. The process of claim 4 wherein from about 9 to about 82 percent filler by weight of finished composition is included as a component in a blending step.

7. The process of claim 1 wherein from about 0.01 to about 2 percent catalyst is used by weight of resin in the finished composition.

8. The process of claim 3 wherein from about 0.01 to about 2 percent catalyst is used by weight of resin in the finished composition.

9. The process of claim 4 wherein from about 0.01 to about 2 percent catalyst is used by weight of resin in the finished composition.

10. The process of claim 6 wherein from about 0.01 to about 2 percent catalyst is used by weight of resin in the finished composition.

11. The process of claim 1 wherein the flash retarding composition is fumed silica in a quantity of from about 3 to about 12 percent by combined weight of resin and hardener in the finished composition.

12. The process of claim 3 wherein the flash retarding composition is fumed silica in a quantity of from about 3 to about 12 percent by combined weight of resin and hardener in the finished composition.

13. The process of claim 4 wherein the flash retarding composition is fumed silica in a quantity of from about 3 to about 12 percent by combined weight of resin and hardener in the finished composition.

14. The process of claim 5 wherein the flash retarding composition is fumed silica in a quantity of from about 3 to about 12 percent by combined weight of resin and hardener in the finished composition.

15. The process of claim 6 wherein the flash retarding composition is fumed silica in a quantity of from about 3 to about 12 percent by combined weight of resin and hardener in the finished composition.

16. The process of claim 7 wherein the flash retarding composition is fumed silica in a quantity of from about 3 to about 12 percent by combined weight of resin and hardener in the finished composition.

17. The process of claim 8 wherein the flash retarding composition is fumed silica in a quantity of from about 3 to about 12 percent by combined weight of resin and hardener in the finished composition.

18. The process of claim 9 wherein the flash retarding composition is fumed silica in a quantity of from about 3 to about 12 percent by combined weight of resin and hardener in the finished composition.

19. The process of claim 2 wherein from 2 to 16 plows are used and the rollers are spaced between 1 and 4 millimeters apart.

20. The process of claim 19 wherein adjacent plows intersect at least one common plane perpendicular to the rotational axis of the hot roller.

21. The process of claim 19 wherein adjacent plows are each within 4 centimeters of at least one identical plane perpendicular to the rotational axis of the hot roller.

22. The process of claim 19 wherein adjacent plows are each within 12 centimeters of at least one identical plane perpendicular to the rotational axis of the hot roller.

23. The process of claim 22 wherein the majority of the plows are at approximately the same angle to planes perpendicular to the rotational axis of the hot roller.

24. The process of claim 2 wherein from about 9 to about 82 percent of a filler by weight of finished composition is included as a component in the blending step.

25. The process of claim 19 wherein from about 9 to about 82 percent of a filler by weight of finished composition is included as a component in the blending step.

26. The process of claim 23 wherein from about 9 to about 82 percent of a filler by weight of finished composition is included as a component in the blending step.

27. The process of claim 2 wherein from about 15 to about 80 percent resin by weight of finished composition is used in the blending step.

28. The process of claim 19 wherein from about 15 to about 80 percent resin by weight of finished composition is used in the blending step.

29. The process of claim 23 wherein from about 15 to about 80 percent resin by weight of finished composition is used in the blending step.

30. The process of claim 24 wherein from about 15 to about 80 percent resin by weight of finished composition is used in the blending step.

31. The process of claim 25 wherein from about 15 to about 80 percent resin by weight of finished composition is used in the blending step.

32. The process of claim 26 wherein from about 15 to about 80 percent resin by weight of finished composition is used in the blending step.

33. The process of claim 2 wherein from about 20 to about 65 percent resin by weight of finished composition is used in the blending step.

34. The process of claim 19 wherein from about 20 to about 65 percent resin by weight of finished composition is used in the blending step.

35. The process of claim 23 wherein from about 20 to about 65 percent resin by weight of finished composition is used in the blending step.

36. The process of claim 24 wherein from about 20 to about 65 percent resin by weight of finished composition is used in the blending step.

37. The process of claim 25 wherein from about 20 to about 65 percent resin by weight of finished composition is used in the blending step.

38. The process of claim 26 wherein from about 20 to about 65 percent resin by weight of finished composition is used in the blending step.

39. The process of claim 2 wherein from about 0.01 to about 2 percent catalyst by weight of resin is used in the blend.

40. The process of claim 19 wherein from about 0.01 to about 2 percent catalyst by weight of resin is used in the blend.

41. The process of claim 23 wherein from about 0.01 to about 2 percent catalyst by weight of resin is used in the blend.

42. The process of claim 29 wherein from about 0.01 to about 2 percent catalyst by weight of resin is used in the blend.

43. The process of claim 38 wherein from about 0.01 to about 2 percent catalyst by weight of resin is used in the blend.

44. The process of claim 2 wherein the flash retarding composition is fumed silica in a quantity of from about 3 to about 12 percent by weight of resin in the blend.

45. The process of claim 19 wherein the flash retarding composition is fumed silica in a quantity of from about 3 to about 12 percent by weight of resin in the blend.

46. The process of claim 23 wherein the flash retarding composition is fumed silica in a quantity of from about 3 to about 12 percent by weight of resin in the blend.

47. The process of claim 29 wherein the flash retarding composition is fumed silica in a quantity of from about 3 to about 12 percent by weight of resin in the blend.

48. The process of claim 42 wherein the flash retarding composition is fumed silica in a quantity of from about 3 to about 12 percent by weight of resin in the blend.

49. The process of claim 2 wherein up to about 1.5 percent lubricant by weight of blend is included in the blend.

50. The process of claim 19 wherein up to about 1.5 percent lubricant by weight of blend is included in the blend.

51. The process of claim 23 wherein up to about 1.5 percent lubricant by weight of blend is included in the blend.

52. The process of claim 29 wherein up to about 1.5 percent lubricant by weight of blend is included in the blend.

53. The process of claim 42 wherein up to about 1.5 percent lubricant by weight of blend is included in the blend.

54. The process of claim 48 wherein up to about 1.5 percent lubricant by weight of blend is included in the blend.

55. The process of claim 2 wherein from about 10 to about 50 percent hardener by weight of resin in the finished composition is incorporated into the blend.

56. The process of claim 19 wherein from about 10 to about 50 percent hardener by weight of resin in the finished composition is incorporated into the blend.

57. The process of claim 23 wherein from about 10 to about 50 percent hardener by weight of resin in the finished composition is incorporated into the blend.

58. The process of claim 29 wherein from about 10 to about 50 percent hardener by weight of resin in the finished composition is incorporated into the blend.

59. The process of claim 42 wherein from about 10 to about 50 percent hardener by weight of resin in the finished composition is incorporated into the blend.

60. The process of claim 48 wherein from about 10 to about 50 percent hardener by weight of resin in the finished composition is incorporated into the blend.

61. The process of claim 54 wherein from about 10 to about 50 percent hardener by weight of resin in the finished composition is incorporated into the blend.

62. The process of any of claims 55 through 61 in the alternative wherein the resin is an epoxidized aromatic alcohol novolac.

63. The process of any of claims 55 through 61 in the alternative wherein the resin is an epoxidized phenol novolac.

64. The process of claim 62 wherein the hardener is a phenol-derived hardener.

65. The process of claim 63 wherein the hardener is a phenol-derived hardener.

66. The process of claim 18 wherein the resin is an epoxidized aromatic alcohol novolac.

67. The process of claim 18 wherein the resin is an epoxidized phenol novolac.

68. The process of claim 66 wherein the hardener is a phenol-derived hardener.

69. The process of any of claims 1 through 61 in the alternative wherein the blending is done in a ball mill.

70. The process of any of claims 55 through 61 in the alternative wherein from about 0.01 to about 3 percent of colorant by weight of resulting blend is included as a component in the blending step.

71. The process of any of claims 55 through 61 in the alternative wherein from about 0.5 to about 10 percent of a flame retardant composition by weight of resulting blend is included as a component in the blending step.

72. The process of any of claims 1 through 61 in the alternative wherein the relative rotational speed of the rollers is between 1.1:1 and 1.3:1.

73. The process of claim 72 wherein the rotational speed of the hot roller is from 10 to 30 rpm.

74. The process of any of claims 55 through 61 in the alternative wherein the surface temperature of the hot roller is between 65° and 95° C.

75. The process of claim 18 wherein the surface temperature of the hot roller is between 65° and 95° C.

76. The process of claim 18 wherein the residence time from inlet to outlet is between 15 and 120 seconds.

77. The process of any of claims 55 through 61 in the alternative wherein the residence time from inlet to outlet is between 15 and 120 seconds.

78. The process of claim 18 wherein prior to milling, each blend is compacted into particles having an average particle size of from 3 to 6 millimeters in diameter and from 3 to 12 centimeters in length.

79. The process of any of claims 55 through 61 in the alternative wherein prior to milling, the blend is compacted into particles having an average particle size of from 3 to 6 millimeters and from 3 to 12 centimeters in length.

80. A flash resistant epoxy encapsulating composition comprising a blend of from about 15 to about 80 weight percent epoxy resin, from about 9 to about 82 weight percent filler, from about 0.01 to about 2 percent catalyst by weight of resin, from about 10 to about 50 percent resin hardener by weight of resin in the composition, from about 3 to about 12 percent flash retardant by combined weight of resin and hardener; and up to about 1.5 weight percent lubricant wherein the cured composition physically consists essentially of particles intimately and entirely embedded in a matrix.

* * * * *